(12) United States Patent
Pelliconi et al.

(10) Patent No.: US 10,862,500 B1
(45) Date of Patent: Dec. 8, 2020

(54) EMBEDDED VARIABLE OUTPUT POWER (VOP) IN A CURRENT STEERING DIGITAL-TO-ANALOG CONVERTER

(71) Applicant: Xilinx, Inc., San Jose, CA (US)

(72) Inventors: Roberto Pelliconi, Imola (IT); Bob Verbruggen, Saggart (IE); Brendan Farley, Donabate (IE); Christophe Erdmann, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/683,731

(22) Filed: Nov. 14, 2019

(51) Int. Cl.
 *H03M 1/66* (2006.01)
 *H04B 1/00* (2006.01)
 *H03M 1/74* (2006.01)

(52) U.S. Cl.
 CPC ............. *H03M 1/66* (2013.01); *H03M 1/742* (2013.01); *H03M 1/747* (2013.01); *H04B 1/0007* (2013.01)

(58) Field of Classification Search
 CPC ........ H03M 1/66; H03M 1/742; H03M 1/745; H03M 1/747; H03M 1/1061; H04B 1/0007
 USPC .................................. 341/144, 136
 See application file for complete search history.

(56) References Cited

U.S. PATENT DOCUMENTS

| | | | |
|---|---|---|---|
| 5,241,310 A | 8/1993 | Tiemann | |
| 5,594,612 A | 1/1997 | Henrion | |
| 6,329,940 B1 * | 12/2001 | Dedic | H03M 1/0827 341/144 |
| 6,420,988 B1 | 7/2002 | Azami et al. | |
| 6,720,898 B1 | 4/2004 | Ostrem | |
| 7,095,347 B2 * | 8/2006 | Hirata | G05F 3/22 341/144 |
| 7,126,406 B2 | 10/2006 | Vadi et al. | |

OTHER PUBLICATIONS

Nicolas Beilleau, Cyrius Ouffoue, Hassan Aboushady, Sinesoidal RF DACs for undersampled LC bandpass modulators, retrieved online on Aug. 8, 2019 from <http://www-soc.lip6.fr/~hassan/mwscas07.pdf>, 4 Pages.

(Continued)

*Primary Examiner* — Khai M Nguyen
(74) *Attorney, Agent, or Firm* — Craige Thompson, Thompson Patent Law

(57) ABSTRACT

Apparatus and associated methods relate to maintaining a total current of a switch cell in a digital-to-analog converter at a controllable operating point by adjusting shunt current control signals applied to programmable shunt current sources in opposite polarity with respect to a tail current control signal applied to a programmable tail current source. In an illustrative example, the total current may flow through differential legs of a switch cell. The programmable shunt current sources may, for example, be configured to compensate for adjustments to the programmable tail current source. In an illustrative example, tail current and shunt currents may flow through a pair of cascode transistors. In various examples, controlling the programmable shunt current sources to compensate adjustments to the tail current source may, for example, permit controlled common mode voltage or operating point so as to reduce device voltage stress over a wider dynamic range of output voltages.

20 Claims, 10 Drawing Sheets

(56) References Cited

OTHER PUBLICATIONS

Yanghyeok Choi, Seonghyun Park, Jieun Yoo, Seol Namgung, Minkyu Song, A Full-swing CMOS Current Steering DAC with an Adaptive Cell and a Quaternary Driver, 2015 IEEE Computer Society Annual Symposium on VLSI, p. 640-645, 6 Pages.

Ahmed Ashry, Hassan Aboushady, A 3.6GS/s, 15mW, 50dB SNDR, 28MHz Bandwidth RF ADC with a FoM of 1pJ/bit in 130nm CMOS, Retrieved online on Aug. 8, 2019 from <https://www.researchgate.net/publication/220910507_A_36GSs_15mW_50dB_SNDR_28MHz_bandwidth_RF_SD_ADC_with_a_FoM_of_1pJbit_in_130nm_CMOS>, 4 Pages.

Behzad Razavi, The Current-Steering DAC, retrieved online on Dec. 8, 2019 from <http://www.seas.ucla.edu/brweb/papers/Journals/BRWinter18DAC.pdf>, p. 11-15, 5 Pages.

Specification and drawings for U.S. Appl. No. 16/249,230, filed Jan. 16, 2019, entitled "Embedded Variable Gain Amplifier in a Current Steering Digital-to-Analog Converter."

\* cited by examiner

| IDAC | VDD | Rterm | Voutp | Voutn | Vcm | Ishunt | SCCS1~2 | TCCS |
|---|---|---|---|---|---|---|---|---|
| 20mA | 3V | 50ohm | 2.65V | 2.15 V | 2.4 V | 2mA | SCCS$_a$ | TCCS$_a$ |
| 10mA | 3V | 50ohm | 2.65 V | 2.4 V | 2.53 V | 4.5mA | SCCS$_b$ | TCCS$_b$ |
| 5mA | 3V | 50ohm | 2.65 V | 2.53 V | 2.59 V | 5.75mA | SCCS$_c$ | TCCS$_c$ |
| 20mA | 3V | 50ohm | 2.65 V | 2.15 V | 2.4 V | 2mA | SCCS$_d$ | TCCS$_c$ |
| 10mA | 3V | 50ohm | 2.53 V | 2.28 V | 2.4 V | 7mA | SCCS$_e$ | TCCS$_e$ |
| 5mA | 3V | 50ohm | 2.46 V | 2.46 V | 2.4 V | 9mA | SCCS$_f$ | TCCS$_f$ |

| IDAC | VDD | Rterm | Voutp | Voutn | Vcm | Ishunt | SCCS | TCCS | Rvar | VRPS |
|---|---|---|---|---|---|---|---|---|---|---|
| 20mA | 3V | 50ohm | 2.65V | 2.15 V | 2.4 V | 2mA | $SCCS_a$ | $TCCS_a$ | Rva1 | VRPS1 |
| 10mA | 3V | 50ohm | 2.65 V | 2.4 V | 2.53 V | 4.5mA | $SCCS_b$ | $TCCS_b$ | Rva2 | VRPS2 |
| 5mA | 3V | 50ohm | 2.65 V | 2.53 V | 2.59 V | 5.75mA | $SCCS_c$ | $TCCS_c$ | Rva3 | VRPS3 |
| 20mA | 3V | 50ohm | 2.65 V | 2.15 V | 2.4 V | 2mA | $SCCS_d$ | $TCCS_c$ | Rva4 | VRPS4 |
| 10mA | 3V | 50ohm | 2.53 V | 2.28 V | 2.4 V | 7mA | $SCCS_e$ | $TCCS_e$ | Rva5 | VRPS5 |
| 5mA | 3V | 50ohm | 2.46 V | 2.46 V | 2.4 V | 9mA | $SCCS_f$ | $TCCS_f$ | Rva6 | VRPS6 |

EMBEDDED VARIABLE OUTPUT POWER (VOP) IN A CURRENT STEERING DIGITAL-TO-ANALOG CONVERTER

CROSS-REFERENCE TO RELATED APPLICATIONS

This application incorporates the entire contents of the U.S. application Ser. No. 16/249,230, titled "Embedded Variable Gain Amplifier in a Current Steering Digital-to-Analog Converter," filed by Xilinx, INC., on Jan. 16, 2019 herein by reference.

TECHNICAL FIELD

Various embodiments relate generally to digital-to-analog converters (DACs).

BACKGROUND

In various electronic systems, information may be converted between digital and analog signal formats. For example, a digitally-encoded data stream may be transmitted as an analog signal and converted to an analog format by a digital-to-analog converter (DAC).

DACs may be employed in a variety of applications. For example, DACs may be used in musical players to convert digital data streams into analog audio signals. DACs may also be used in communication systems. Communication systems transport data from a transmitter to a receiver over a data link. Before transmission, data encoded in digital format may be converted to analog format by DACs. The analog signal generated by the DAC may be amplified by a variable gain amplifier (VGA), and the VGA may then amplify the analog signal. A radio frequency (RF) power amplifier, driving the antenna of a transmitter, may convert a low-power radio-frequency signal (e.g., the amplified analog signal) into a higher power signal. Different bias voltages applied at the input of the RF power amplifier may make the RF power amplifier operate in different modes.

DACs with an embedded variable gain amplifier (e.g., current steering DAC) may be applied in the transmitter to perform both data format conversion and amplification. Performance of a DAC with an embedded variable gain amplifier may depend on various factors, such as, resolution, linearity performance, and conversion speed of the DAC, for example.

SUMMARY

Apparatus and associated methods relate to maintaining a total current of a switch cell in a DAC at a controllable operating point by adjusting shunt current control signals applied to a pair of programmable shunt current sources in opposite polarity with respect to a tail current control signal applied to a programmable tail current source. In an illustrative example, the total current may flow through differential legs of a switch cell. The pair of programmable shunt current sources may, for example, be configured to compensate for adjustments to the programmable tail current source. In an illustrative example, tail current and shunt currents may flow through a pair of cascode transistors. In various examples, controlling the programmable shunt current sources to compensate adjustments to the tail current source may, for example, permit controlled common mode voltage or operating point so as to reduce device voltage stress over a wider dynamic range of output voltages.

Various embodiments may achieve one or more advantages. For example, some embodiments may allow the output power of the DAC to be set independently from a board-level power supply. Thus, power amplifiers (e.g., RF power amplifiers) that connects to the DAC may receive different bias voltages to meet different design specifications. Also, the output power of the DAC may be dynamically programmable during operation, such that the electrical (e.g., voltage) stress suffered by cascode transistors in the DAC may be managed. Accordingly, the reliability of the DAC may be advantageously improved.

Some embodiments may also include a variable resistance network coupled to a bias node voltage and the drain electrodes of the differential pair of transistors. Thus, the DAC's output power ranges may be widened. In some embodiments, the differential resistance network may be programmable to further adjust the bias node voltage supplied to the drain electrodes of the differential pair of transistors. Thus, output power ranges of the DAC may be further widened while keeping the board-level power supply constant. In some embodiments that incorporate a capacitance may advantageously improve the high frequency performance of the DAC. In some embodiments, the two programmable shunt current sources may also be used to enhance the linearity performance of the DAC.

In one exemplary aspect, a circuit includes (a) a switch cell circuit having at least one switch cell, each of the at least one switch cells having (a1) a differential pair of transistors having respective first and second control nodes, respective first and second shunt nodes, and a tail current node, (a2) a programmable tail current source, having two terminals, configured to draw current proportional to a tail current control signal with one terminal coupled to the tail current node and the other terminal coupled to a predetermined reference voltage, (a3) a first programmable shunt current source, having two terminals, configured to draw current proportional to a first shunt current control signal with one terminal coupled to the first shunt node and the other terminal coupled to the predetermined reference voltage, and, (a4) a second programmable shunt current source, having two terminals, configured to draw current proportional to a second shunt current control signal with one terminal coupled to the second shunt node and the other terminal coupled to the predetermined reference voltage. The circuit also includes (b) a pair of differential resistances coupled between a bias node and corresponding shunt nodes of the differential pair of transistors. The first and second programmable shunt current sources are configured to compensate for adjustments to the tail current by maintaining a total current of the switch cell at a controllable operating point by adjusting the first and second shunt current control signals in opposite polarity with respect to the tail current control signal.

In some embodiments, each of the at least one switch cells may also include (a5) a pair of cascode transistors coupled between a corresponding resistance of the pair of differential resistances and a corresponding shunt node of the differential pair of transistors. In some embodiments, the circuit may also include a control circuit configured to generate the first and second shunt current control signals as a function of predetermined circuit parameters. In some embodiments, the circuit parameters may also include resistance values of first resistance and the second resistance.

In some embodiments, the control circuit may also include a processing engine and a data store coupled to the processing engine and containing a program of instructions that, when executed by the processing engine, cause the processing engine to perform operations to generate the first and second shunt control signals in response to a first lookup table storing one or more predetermined settings for the shunt current control signals as a function of the tail current control signals.

In some embodiments, the circuit may also include (c) a programmable resistance coupled between a power supply node and the bias node, wherein the programmable resistance comprises a variable resistance configured to adjust a voltage at the bias node to one of a predetermined set of resistance values in response to a variable resistance programming signal (VRPS). In some embodiments, the control circuit may be further configured to generate the VRPS in response to a second lookup table storing one or more predetermined settings for the VRPS. In some embodiments, the circuit parameters may also include the voltage value at the bias node. In some embodiments, the circuit may also include a capacitance arranged in a parallel configuration with at least a portion of the programmable resistance. In some embodiments, the first and second shunt control signals may be independently controllable with respect to each other.

In another exemplary aspect, a method includes (a) providing a differential pair of transistors having respective first and second control nodes, respective first and second shunt nodes, and a tail current node, (b) providing a programmable tail current source having two terminals, configuring the programmable tail current source to draw current proportional to a tail current control signal, coupling one terminal to the tail current node and coupling the other terminal to a predetermined reference voltage, (c) providing a first programmable shunt current source having two terminals, configuring the first programmable shunt current source to draw current proportional to a first shunt current control signal, coupling one terminal to the first shunt node and coupling the other terminal to the predetermined reference voltage, (d) providing a second programmable shunt current source having two terminals, configuring the second programmable shunt current source to draw current proportional to a second shunt current control signal and, coupling one terminal to the second shunt node and coupling the other terminal to the predetermined reference voltage, and, (e) coupling a pair of differential resistances between a bias node and corresponding shunt nodes of the differential pair of transistors. The first and second programmable shunt current sources are configured to compensate for adjustments to the tail current by maintaining a total current of the switch cell at a controllable operating point by adjusting the first and second shunt current control signals in opposite polarity with respect to the tail current control signal.

In some embodiments, the method may also include (f) coupling a pair of cascode transistors between a corresponding resistance of the pair of differential resistances and a corresponding shunt node of the differential pair of transistors. In some embodiments, the method may also include configuring a control circuit to generate the first and second shunt current control signals as a function of predetermined circuit parameters. In some embodiments, wherein the circuit parameters may also include resistance values of first resistance and the second resistance. In some embodiments, the control circuit may include a processing engine and a data store coupled to the processing engine and containing a program of instructions that, when executed by the processing engine, cause the processing engine to perform operations to generate the first and second shunt current control signals in response to a first lookup table storing one or more predetermined settings for the shunt current control signals as a function of the tail current control signals.

In some embodiments, the method may also include providing a programmable resistance coupled between a power supply node and the bias node, wherein the programmable resistance comprises a variable resistance configured to adjust a voltage at the bias node to one of a predetermined set of resistance values in response to a variable resistance programming signal (VRPS). In some embodiments, the control circuit may be further configured to generate the VRPS in response to a second lookup table storing one or more predetermined settings for the VRPS. In some embodiments, the circuit parameters may also include the voltage value at the bias node. In some embodiments, the method may also include providing a capacitance arranged in a parallel configuration with at least a portion of the programmable resistance. In some embodiments, the first and second shunt control signals may be independently controllable with respect to each other.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to maintaining a total current of a switch cell in a DAC at a controllable operating point by adjusting shunt current control signals applied to a pair of programmable shunt current sources in opposite polarity with respect to a tail current control signal applied to a programmable tail current source. In an illustrative example, the total current may flow through differential legs of a switch cell. The pair of programmable shunt current sources may, for example, be configured to compensate for adjustments to the programmable tail current source. In an illustrative example, tail current and shunt currents may flow through a pair of cascode transistors. In various examples, controlling the programmable shunt current sources to compensate adjustments to the tail current source may, for example, permit controlled common mode voltage or operating point so as to reduce device voltage stress over a wider dynamic range of output voltages.

To aid understanding, this document is organized as follows. An exemplary platform (e.g., FPGA) suitable to perform data communication and signal conversion is briefly introduced with reference to FIG. 1. Second, with reference to FIGS. 2-4B, an exemplary digital-to-analog converter (DAC) that may generate different output voltages, an exemplary control circuit that may be used to provide control signals for current sources to program the DAC to generate the different output voltages, and the method to implement the DAC are discussed. With reference to FIGS. 5-8, the discussion turns to other exemplary embodiments of the DAC, the control circuit, and an exemplary method of how a control circuit may work to generate the control signals for current sources to program the DAC. Finally, with reference to FIG. 9, another exemplary platform (e.g., SOC) suitable to perform data communication and signal conversion is briefly introduced.

Figure 1:
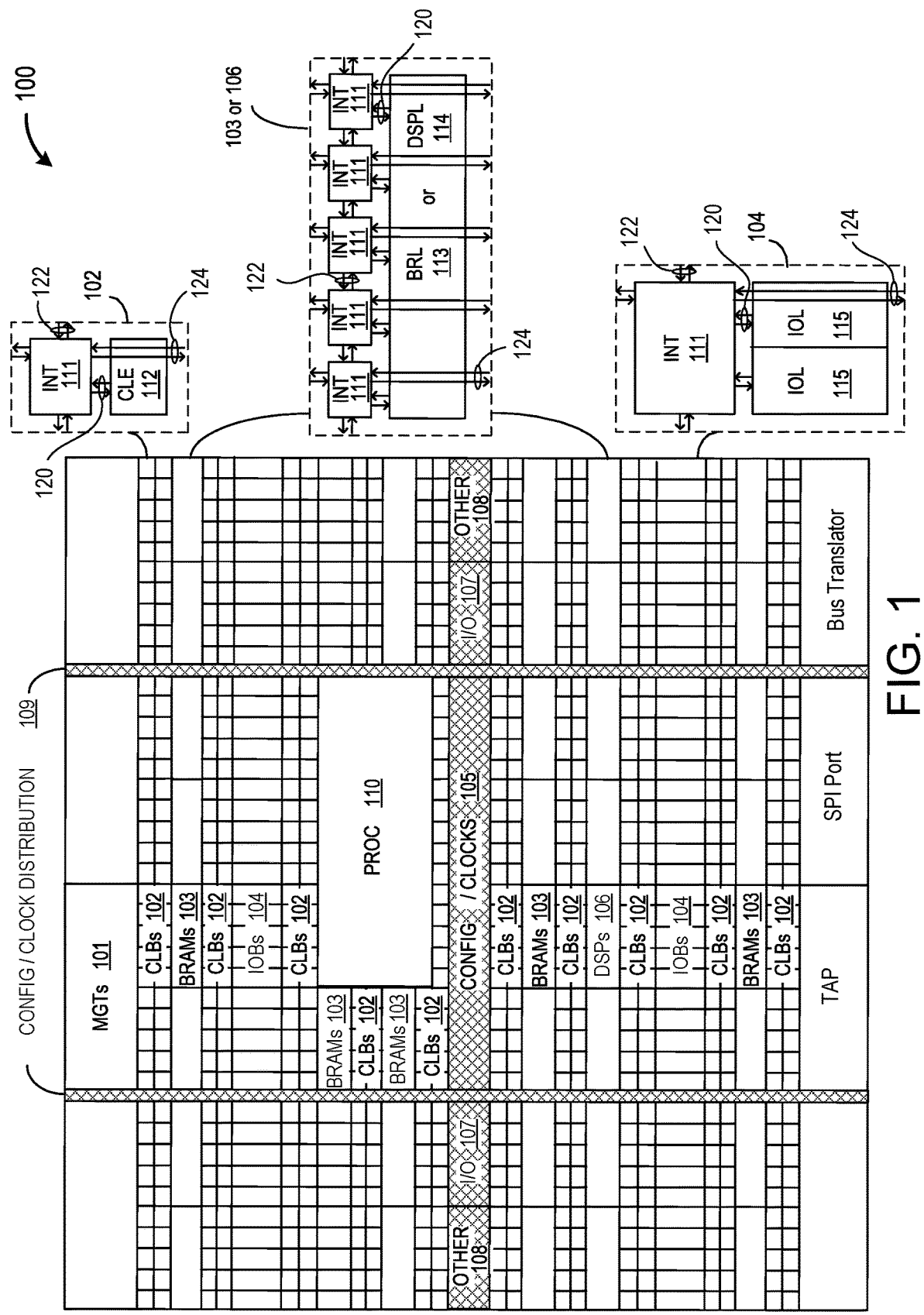
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

In some embodiments, some parts of a transceiver may be embedded in an integrated circuit (e.g., FPGA) to perform data transmitting and/or data receiving during communication. Digital-to-analog converters (DACs) are used to convert digital signals into analog signals. Variable gain amplifiers may be embedded in the DAC (e.g., current-steering DAC) to provide a desired output power for a power amplifier (PA). The PA may amplify a modulated signal and deliver the modulated signal to an antenna for transmission over a communication medium. In some situations, the desired output power may be different to make the PA work in different modes. By programming circuit settings of the DAC, different output voltages may be achieved without changing a board-level supply $V_{DD}$.

Figure 2:
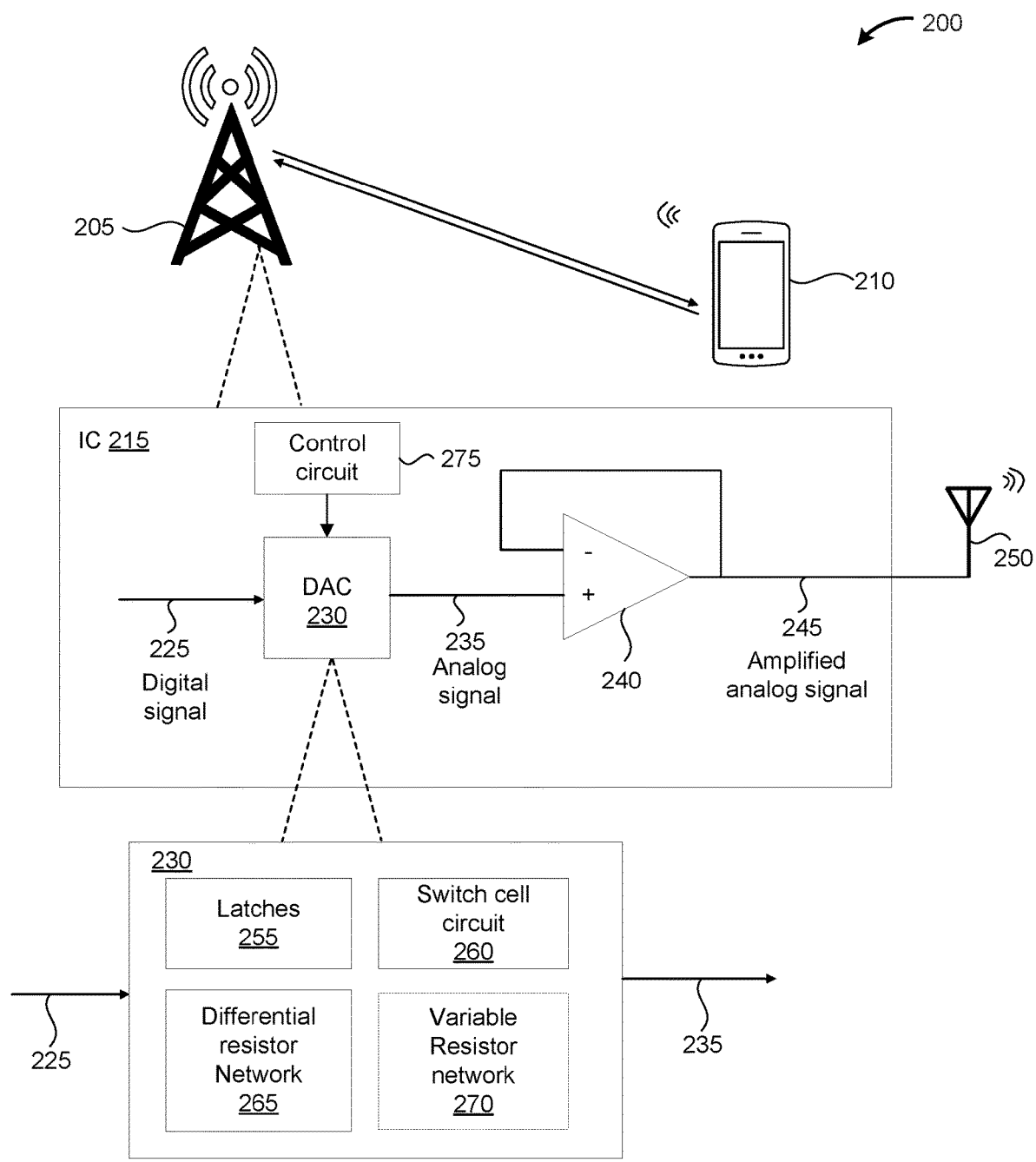
FIG. 2 depicts an exemplary digital-to-analog converter (DAC) implemented in a communication system.

FIG. 2 depicts an exemplary digital-to-analog converter (DAC) implemented in a communication system. In this depicted example, a communication system 200 includes a base station 205. The base station 205 may be used to transmit and receive data from some data communication devices. In this exemplary example, the base station 205 transmits a digital signal to a portable communication device (e.g., cell phone) 210. The base station 205 includes an integrated circuit (IC) 215 to perform data communication from the base station 205 to the cell phone 210. The IC 215 may include an FPGA.

In this depicted example, the IC 215 includes a digital-to-analog converter (DAC) 230. A digital signal 225 is received by the DAC 230 and converted to an analog signal 235. The analog signal 235 is then amplified by an amplifier (e.g., power amplifier) 240 to form an amplified analog signal 245. The amplified analog signal 245 is delivered to an antenna 250 for transmission over a communication medium (not shown). In some embodiments, the IC 215 may also include one or more filters to process the analog signal 235 before the amplification.

The DAC 230 includes latches 255. Latches 255 may generate a set of gate control signals. In some embodiments, the DAC 230 may also include a decoder (not shown) that configured to receive the digital signal 225 and convert words in the digital signal 225 into binary signals. The latches 255 may be coupled to the output of the decoder to generate the gate control signals. The DAC 230 also includes a switch cell circuit 260. The gate control signals may be used to control switches in the switch cell circuit 260. The DAC 230 also includes a differential resistance network 265 that functions as termination resistances for the switch cell circuit 260. In radio applications, depending on how far the data is to be transmitted, the amplitude of the differential analog data signal may be changed. Therefore, the output power of the DAC 230 may be adjusted to fulfill the transmitting. The switch cell circuit 260 is designed to dynamically adjust the output power of the DAC 230. An example of a DAC architecture is described in further detail with reference to FIG. 3. In some embodiments, the DAC 230 may also include a variable resistance network 270 to further adjust the output power. An example of a DAC architecture with a variable resistance network is described in further detail with reference to FIG. 5. The IC 215 includes a control circuit 275 that is configured to control settings of the switch cell circuit 260 to dynamically adjust the output power of the DAC 230. An example of a control circuit 275 is described in further detail with reference to FIG. 4A.

Figure 3:
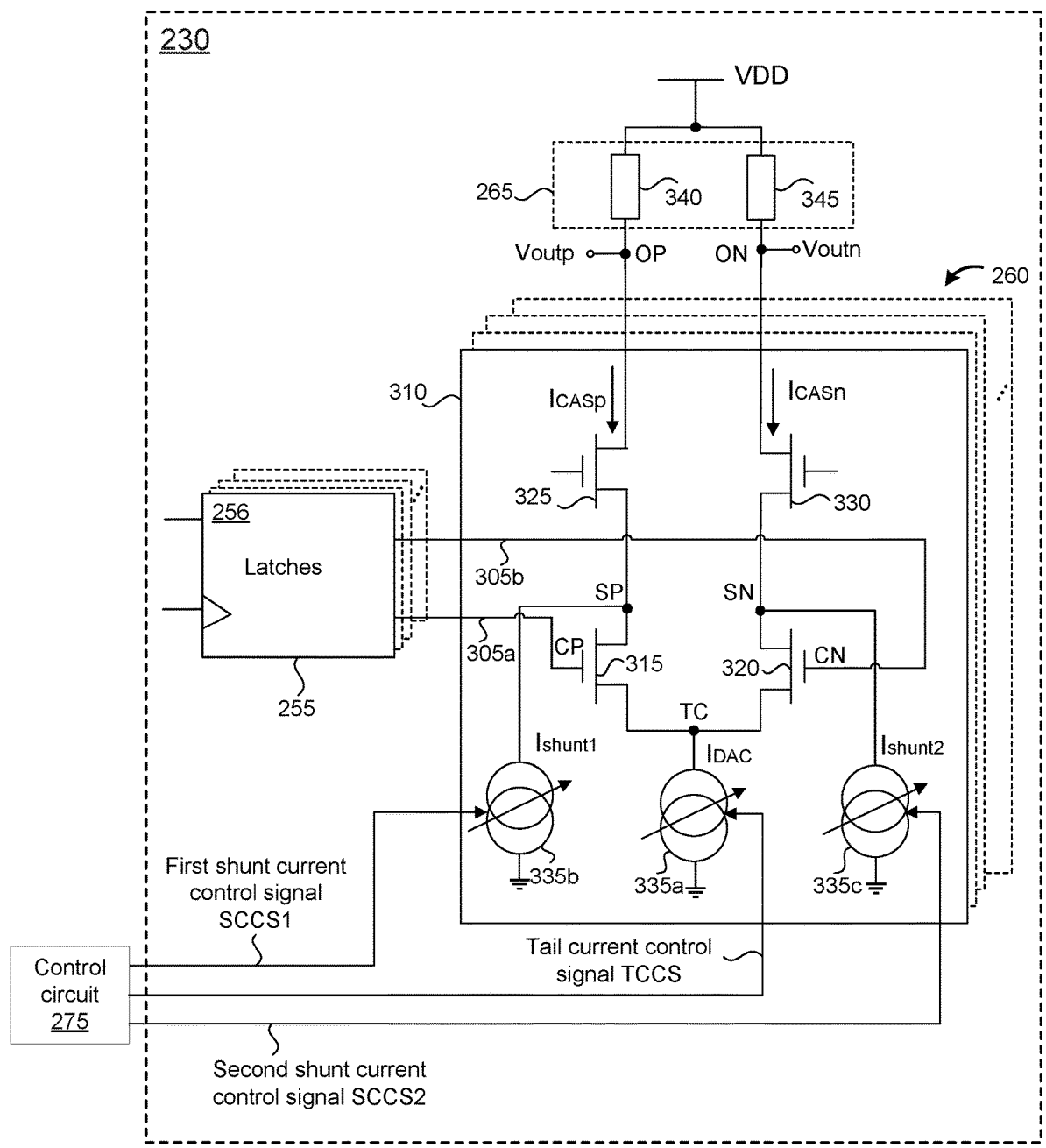
FIG. 3 depicts an exemplary architecture of a current-steering DAC.

FIG. 3 depicts an exemplary architecture of a current-steering DAC. In this depicted example, a current steering DAC 230 includes the latches 255 that generate gate control signals for the switch cell circuit 260. In this depicted example, the latches 255 include multiple slices of latches. The current steering DAC 230 also includes the switch cell circuit 260. The binary signals may be applied to switches in the switch cell circuit 260 to steer current to the positive output of the current steering DAC 230. In this embodiments, the switch cell circuit 260 includes multiple slices (e.g., four slices) of switch cells 310. In some embodiments, the switch cell circuit 260 may include switch cells between 1 and 128 connected in parallel. For example, the switch cell circuit 260 may include 63 switch cells connected in parallel. Each slice of latch in the latches 255 may generate a corresponding set of gate control signals for a switch cell in the switch cell circuit 260. For example, a first slice of latch 256 generates gate control signals 305a and 305b for a first switch cell 310 in the switch cell circuit 260.

The switch cell 310 includes a first pair of switches/transistors (e.g., MOSFETs, BJTs). The first pair of switches includes a first transistor 315 and a second transistor 320. In this depicted example, the first pair of transistors 315 and 320 are N-type metal-oxide-semiconductor field-effect-transistors (NMOSFETs). The first transistor 315 and the second transistor 320 have respective control nodes (e.g., gate electrode) CP and CN on which the respective gate control signals 305a, 305b (e.g., the differential gate voltage) are received. The first pair of transistors also have respective first shunt node (e.g., drain electrode) SP and second shunt node SN, and sources. The two source electrodes of the first NMOSFET 315 and the second NMOSFET 320 are coupled at a tail current node TC.

The switch cell 310 also includes a programmable tail current source 335a coupled between the tail current node TC and a predetermined reference voltage (e.g., GND). A current with an amplitude $I_{DAC}$ is supplied to the programmable tail current source 335a. A tail current control signal (TCCS) is applied to the programmable tail current source 335a to program the amplitude $I_{DAC}$. The switch cell 310 also includes a first programmable shunt current source 335b coupled between the first shunt node SP and the predetermined reference voltage (e.g., GND). A first shunt current control signal (SCCS1) is be applied to the first programmable shunt current source 335b to program a first current amplitude $I_{shunt1}$. The switch cell 310 also includes a second programmable shunt current source 335c coupled between the second shunt node SN and the predetermined reference voltage (e.g., GND). A second shunt current control signal (SCCS2) is be applied to the second programmable shunt current source 335b to program a second current amplitude $I_{shunt2}$. Thus, a total current flows through the switch cell 310 may be expressed as $I_{total}=I_{DAC}+I_{shunt1}+I_{shunt2}$. The two programmable shunt current sources may have different current values to offset asymmetric performances.

The first and second programmable shunt current sources 335b-335c are configured to compensate for adjustments to the tail current by maintaining the total current of the switch cell at a controllable operating point by adjusting the first and second shunt current control signals in opposite polarity with respect to the tail current control signal. By adjusting the shunt current amplitudes $I_{shunt1}$ and $I_{shunt2}$, the current flows through the switches 315 and 320 may be dynamically adjusted, and the differential output voltages $V_{outp}$ and $V_{outn}$ may be programmable while a common mode voltage $V_{CM}$ may be maintained constant or in a predetermined controllable operating point.

In some embodiments, the first programmable shunt current source 335b and the second programmable shunt current source 335c may be controlled by the same shunt current control signal to have the same amplitude $I_{shunt}$, and the total current flows through the switch cell 310 may be expressed as $I_{total}=I_{DAC}+2I_{shunt}$. In some embodiments, the two programmable shunt current sources 335b-335c may further be used to improve the linearity performance of the DAC 230. In some embodiments, the other terminal of the programmable tail current source 335a may be coupled to the ground potential GND, and the first and second programmable shunt current sources 335b-335c may be coupled to a different reference voltage to reduce voltage stress across the two programmable shunt current sources 335b-335c.

In this depicted example, the switch cell 310 also includes a pair of cascode transistors 325 and 330. In this depicted example, the cascode transistors 325 and 330 are NMOSFETs. The two sources of the cascode transistors 325 and 330 are coupled to the respective first shunt and second shunt node SP and SN. The cascode transistors 325 and 330 may reduce the Miller effect and further regulating voltages $V_{outp}$ and $V_{outn}$ at the output nodes OP and ON of the DAC 230. Respective gates of the cascode transistors 325 and 330 are configured to receive an enable signal (not shown). In some embodiments, the switches and transistors may be P-channel metal-oxide-semiconductor field-effect-transistors (PMOSFETs).

The DAC 230 also includes a differential resistance network 265. The differential resistance network 265 is coupled between a board-level supply VDD and the switch cell circuit 260. The differential resistance network 265 includes a first termination resistance 340 and a second termination resistance 345 coupled to respective drains of the cascode transistors 325 and 330. The current flows through the cascode transistor 325 may have an amplitude of $I_{CASp}$, and the current flows through the cascode transistor 330 may have an amplitude of $I_{CASn}$.

The two gate control signals 305a-305b may steer current in the first switch cell 310 either to the left-hand side through the left termination resistance 340 or to the right-hand side through the right termination resistance 345 when the gate control signals 305a-305b are 0 or 1. By programming the current amplitudes (e.g., $I_{shunt1}$, $I_{shunt2}$) of the two programmable shunt current sources 335b and 335c, the current amplitude $I_{DAC}$ of the programmable tail current source 335a may be dynamically adjusted without changing the common mode voltage $V_{CM}$. Thus, the differential output voltages $V_{outp}$ and $V_{outn}$, as a function of the gate control signals 305a and 305b, may be adjusted, and accordingly, the output power (e.g., the differential output voltage $V_{outdiff}=V_{outp}-V_{outn}$) may be adjusted without changing the board-level supply $V_{DD}$ and the common mode output voltage $V_{CM}$ of the switch cell 310 may be kept constant or adjusted. In addition, as the differential output voltages $V_{outp}$ and $V_{outn}$ are programmable (for example, both $V_{outp}$ and $V_{outn}$ are programmed to less than or equal to 2.65V), the stress suffered by the cascode transistors 325-330 may be controlled to improve the DAC's reliability.

Figure 4A:
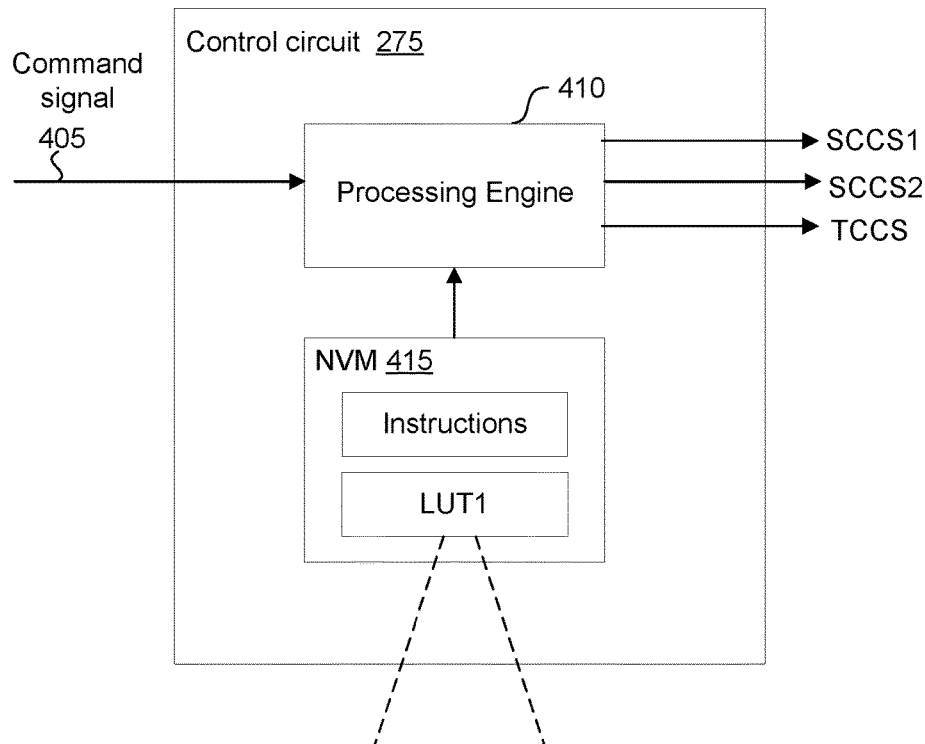
FIG. 4A depicts an exemplary control circuit used for the DAC described with reference to FIG. 3.

FIG. 4A depicts an exemplary control circuit used for the DAC described with reference to FIG. 3. The control circuit 275 includes a processing engine 410 configured to receive a command signal 405 (e.g., from a user) and then generate the SCCS1, SCCS2 and the TCCS. The control circuit 275 also includes a non-volatile memory (NVM) 415 coupled to the processing engine 410. The NVM 415 contains a program of instructions that, when executed by the processing engine 410, cause the processing engine to perform operations to generate the SCCS1, SCCS2 and the TCCS. Exemplary operations performed by the processing engine 410 is described in further detail with reference to FIG. 7.

The NVM 415 also includes a first lookup table (LUT) that stores precalculated circuit settings and corresponding current source programming signals (e.g., the SCCS1, SCCS2 and the TCCS). For example, the first LUT may include desired $I_{DAC}$ values, board-level power supply $V_{DD}$, termination resistances $R_{term}$, current values of the programmable shunt current sources $I_{shunt1}$ and $I_{shunt2}$, and corresponding current source programming signals (e.g., SCCS1=SCCS2, and $I_{shunt1}=I_{shunt2}$) to program the programmable shunt current sources and the programmable tail current source to obtain the predetermined current value $I_{DAC}$ and the differential output voltages $V_{outp}$ and $V_{outn}$. Therefore, the maximum and minimum differential output voltages $V_{outp}$ and $V_{outn}$ may be set. For example, when $V_{DD}$=3V, and both termination resistances $R_{term}$ 340 and 345 are 50 ohm, to obtain a desired differential output voltage $V_{outdiff}$ (e.g., 0V, 0.12V, 0.15V, 0.25V, 0.4V, 0.5V, . . . ), corresponding current amplitude $I_{DAC}$ (e.g., 20 mA, 10 mA, . . . ) flowing through the two switches 315 and 320 may be obtained by selecting corresponding current amplitude $I_{shunt1}$ and $I_{shunt2}$ (e.g., 2 mA, 7 mA, . . . ). The processing engine 410 may then retrieve corresponding current source programming signals (e.g., the SCCS1, SCCS2 and the TCCS) and apply the retrieved current source programming signals (e.g., the SCCS1, SCCS2 and the TCCS) to the programmable shunt current sources 335b-335c and the tail current source 335a to obtain the corresponding current amplitudes $I_{shunt1}$, $I_{shunt2}$ and $I_{DAC}$. Thus, the output power (e.g., differential output voltage $V_{outdiff}=V_{outp}-V_{outn}$) may be adjusted without changing the board-level supply $V_{DD}$ and the common mode output voltage $V_{CM}$ of the switch cell 310 may be kept constant (e.g., 2.0 V) or at a controllable operating point (e.g., 2.2 V). In addition, as the differential output voltages $V_{outp}$ and $V_{outn}$ are programmable (for example, both $V_{outp}$ and $V_{outn}$ are programmed to less than or equal to a maximum limit (e.g., 2.65V)), the stress suffered by the cascode transistors 325-330 may be controlled to improve the DAC's reliability.

Figure 4B:
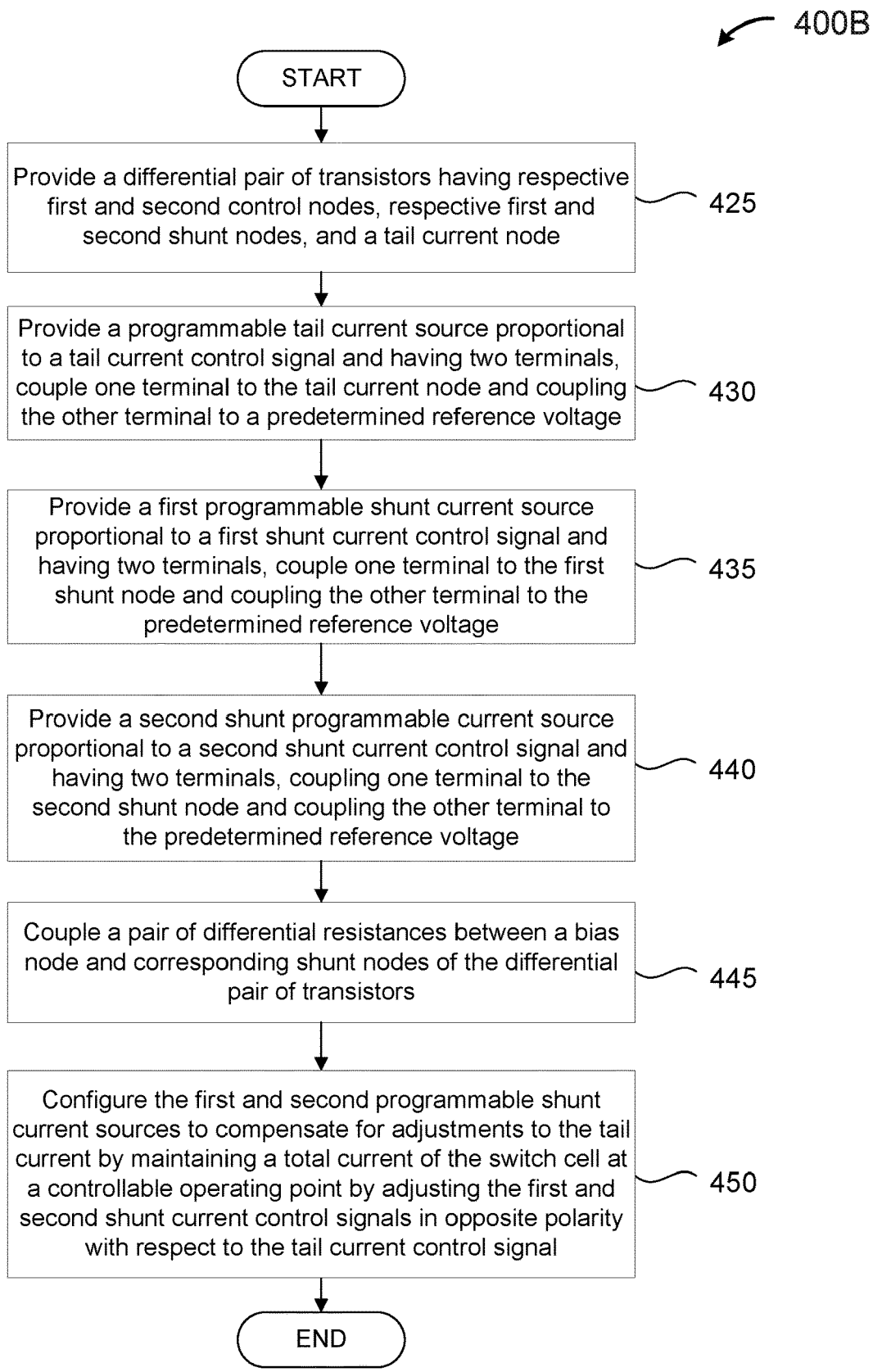
FIG. 4B depicts a flow chart of an exemplary method to implement the DAC described with reference to FIG. 3.

FIG. 4B depicts a flow chart of an exemplary method to implement the DAC described with reference to FIG. 3. An exemplary method 400B to implement the DAC 230 (e.g., when the switch cell circuit 260 has one switch cell 310) is discussed. The method 400B includes, at 425, providing a differential pair of transistors (e.g., the differential pair of transistors 315 and 320) having respective first and second control nodes (e.g., the control nodes CP and CN), respective first and second shunt nodes (e.g., the shunt nodes SP and SN), and a tail current node (e.g., the tail current node TC). The method 400B also includes, at 430, providing a first current source (e.g., the programmable tail current source 335a) proportional to a tail current control signal (e.g., the TCCS) and having two terminals, coupling one terminal of the programmable tail current source 335a to the tail current node TC and coupling the other terminal of the programmable tail current source 335a to a predetermined reference voltage (e.g., ground potential GND).

The method 400B also includes, at 435, providing a first programmable shunt current source (e.g., the first programmable shunt current source 335b) proportional to a first shunt current control signal (e.g., the SCCS1) and having two terminals, coupling one terminal of the first programmable shunt current source 335b to the first shunt node SP and coupling the other terminal the first programmable shunt current source 335b to the predetermined reference voltage GND. The method 400B also includes, at 440, providing a second programmable shunt current source (e.g., the second programmable shunt current source 335c) proportional to a second shunt current control signal (e.g., the SCCS2) and having two terminals, coupling one terminal of the second programmable shunt current source 335c to the second shunt node SN and coupling the other terminal of the second programmable shunt current source 335c to the predetermined reference voltage GND.

The method 400B also includes, at 445, providing a pair of differential resistances (e.g., the differential resistance network 265 having a first termination resistance 340 and a second termination resistance 345) coupled between a bias node providing a reference voltage supply (e.g., $V_{DD}$) and corresponding shunt nodes SP, SN of the differential pair of transistors 315, 320. For example, the first termination resistance 340 is coupled between the voltage supply $V_{DD}$ and the first shunt nodes SP, and the second termination resistance 345 is coupled between the voltage supply $V_{DD}$ and the second shunt nodes SN.

The method 400B also includes, at 450, configuring the first and second programmable shunt current sources to compensate for adjustments to the tail current by maintaining a total current of the switch cell at a controllable operating point by adjusting the first and second shunt current control signals in opposite polarity with respect to the tail current control signal. By programming the current amplitudes of the two programmable shunt current sources 335b and 335c, the current amplitude $I_{DAC}$ of the programmable tail current source 335a may be dynamically adjusted without changing the total common-mode current of 335a, 335b and 335c. Thus, the output power of the DAC 230 may be adjusted without changing the board-level supply $V_{DD}$.

Figure 5:
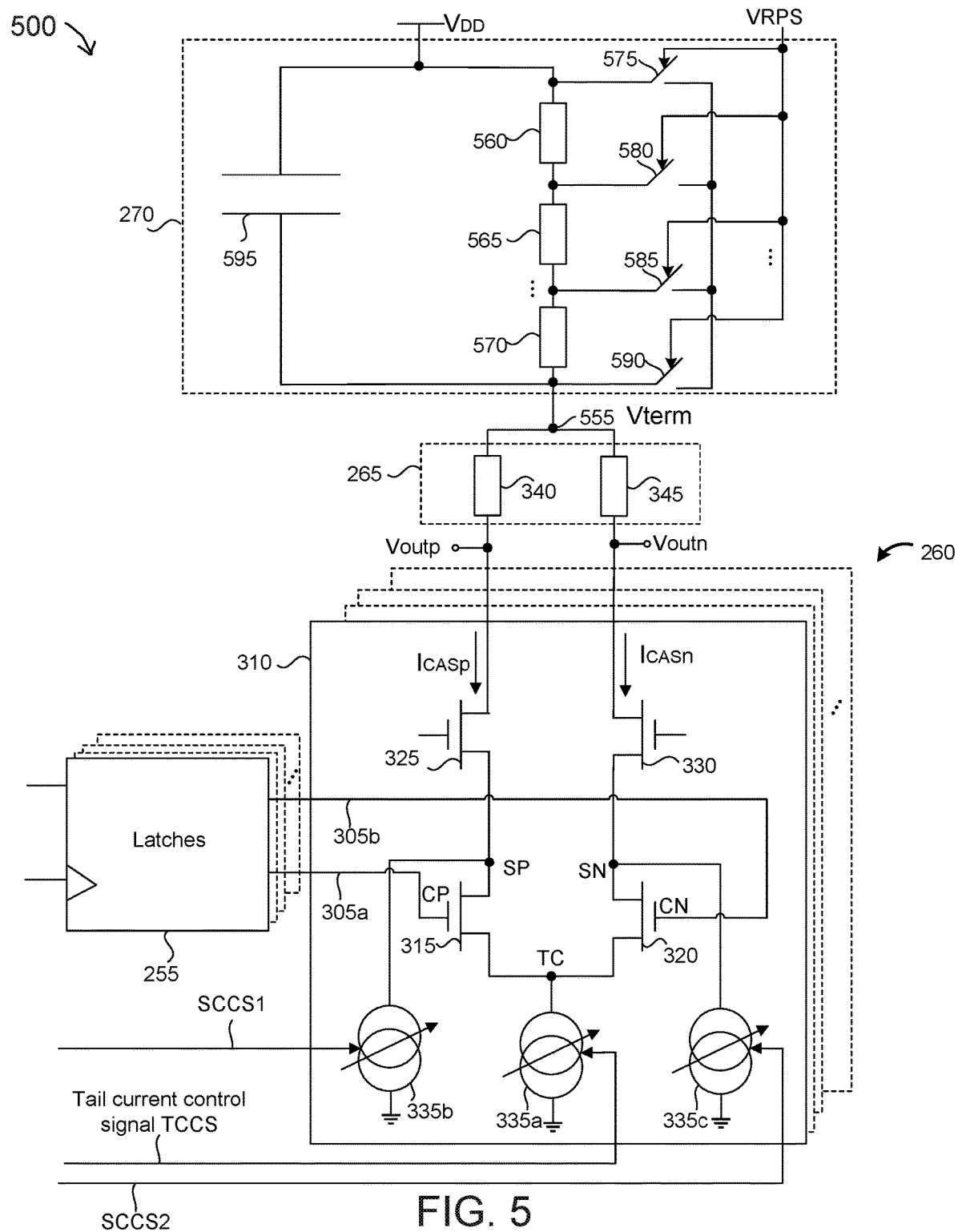
FIG. 5 depicts another exemplary architecture of a current-steering DAC.

FIG. 5 depicts another exemplary architecture of a current-steering DAC. In this depicted example, an DAC 500 includes the latches 255, the switch cell circuit 260 having programmable shunt current sources, and the differential resistance network 265. In this depicted example, the DAC 500 also includes a variable resistance network 270. The variable resistance network 270 is a common mode variable resistance network that connects with the differential resistance network 265 through a bias node 555. The other end of the variable resistance network 270 is coupled to an external board-level power supply $V_{DD}$.

The resistance of the variable resistance network 270 may be programmed to make the bias node 555 obtain a desired voltage $V_{term}$. Accordingly, a total current flowing through the switch cell circuit 260 may be adjusted. The variable resistance network 270 includes one or more resistances (e.g., resistances 560,565,570). The variable resistance network 270 also includes one or more switches (e.g., switch 575,580,585,590). Each switch of the one or more switches is controlled by a variable resistance programming signal (VRPS). The VRPS may also be generated by the control circuit 275. The resistances and switches in the variable resistance network 270 form multiple resistance paths with different resistances. By selecting different VRPSs, different resistance values may be obtained. Therefore, obtaining the same voltage $V_{term}$ at the bias node 555 for different values of the total current flowing through the switch cell, allowing a selected gain mode and/or a selected signal swing.

In some embodiments, the switches may be digital switches. In some embodiments, the switches may be metal-oxide-semiconductor field effect transistors (MOSFETs). In various implementations, the programmable variable resistance network 270 may advantageously enable the DAC 500 to operate with a widened range of supply voltages (e.g., $V_{DD}$). In addition, some embodiments may adaptively condition signals to match a range of load specifications. The DAC 500 also includes a capacitor 595 that is connected with the variable resistance network 270 in parallel. The capacitor 595 may advantageously improve the performance of the DAC 500 when the DAC 500 works in high frequency.

By further introducing the variable resistance network 270, the differential resistance network 265 and the switch cell circuit 260 may receive a controllable common mode voltage that is independent of the external board-level supply $V_{DD}$, and the voltage value $V_{term}$ at the bias node 555 can be programmed. The DAC 500 may be able to generate a widened range of output power. As a result, a differential gain level can be set independently, and the board-level power supply $V_{DD}$ can remain constant for different total current values of the current sources 335a-335c. By introducing the variable resistance network 270, the reliability problems of those transistors 315,320,325,330 may be further reduced. In some embodiments, the variable resistance network 270 may be arranged off chip. In some embodiments, the variable resistance network 270 may be formed or modified (e.g., trimmed) by hardware resources on, for example, the FPGA 215.

Figure 6:
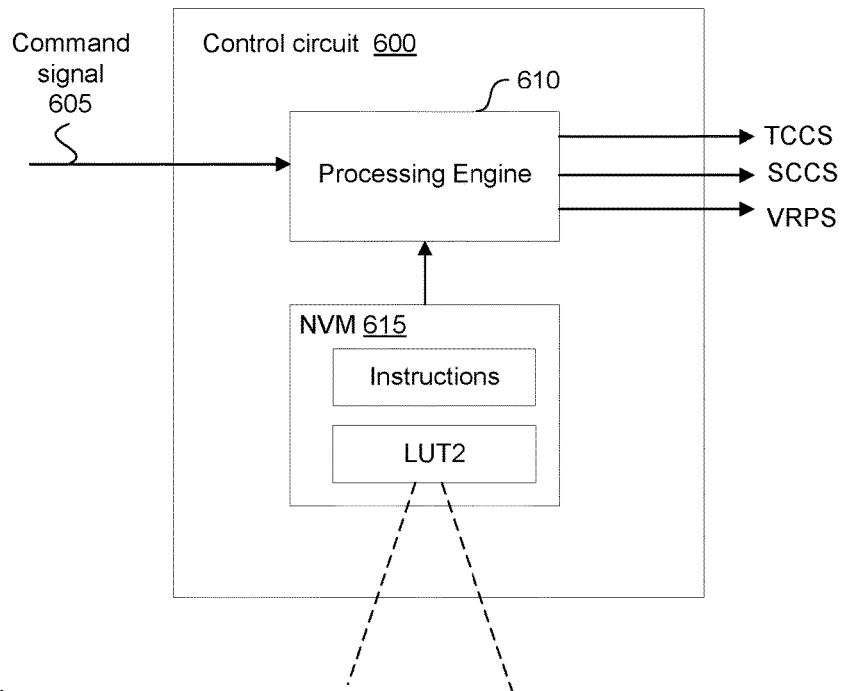
FIG. 6 depicts another exemplary control circuit used for the DAC described with reference to FIG. 5.

FIG. 6 depicts another exemplary control circuit used for the DAC described with reference to FIG. 5. In this depicted example, the control circuit 600 includes a processing engine 610 configured to receive a command signal 605 (e.g., from a user) and then generate the current source programming signal CSPS and the variable resistance programming signal VRPS. The control circuit 600 also includes a non-volatile memory (NVM) 615 coupled to the processing engine 610. The NVM 615 contains a program of instructions that, when executed by the processing engine 610, cause the processing engine 610 to perform operations to generate the current control signals (e.g., the SCCS1, SCCS2 and the TCCS) and the variable resistance programming signal VRPS. Exemplary operations performed by the processing engine 610 is described in further detail with reference to FIG. 7.

The NVM 615 also includes a second lookup table (LUT) that stores precalculated circuit settings and corresponding current source programming signals. For example, in this second LUT, the second lookup table contains information of desired $I_{DAC}$ values, board-level power supply $V_{DD}$, termination resistances $R_{term}$, corresponding differential output voltage outputs $V_{outp}$ and $V_{outn}$, current values of the programmable shunt current sources, corresponding current control signals (e.g., the SCCS and the TCCS), corresponding resistances $R_{var}$ of the variable resistance network 270 and corresponding VRPS. By introducing the programmable shunt current sources and the variable resistance network 270, the differential resistance network 265 and the switch cell circuit 260 may receive a controllable common mode voltage that is independent of the external board-level supply $V_{DD}$, and the output voltage of the DAC can be dynamically adjusted.

Figure 7:
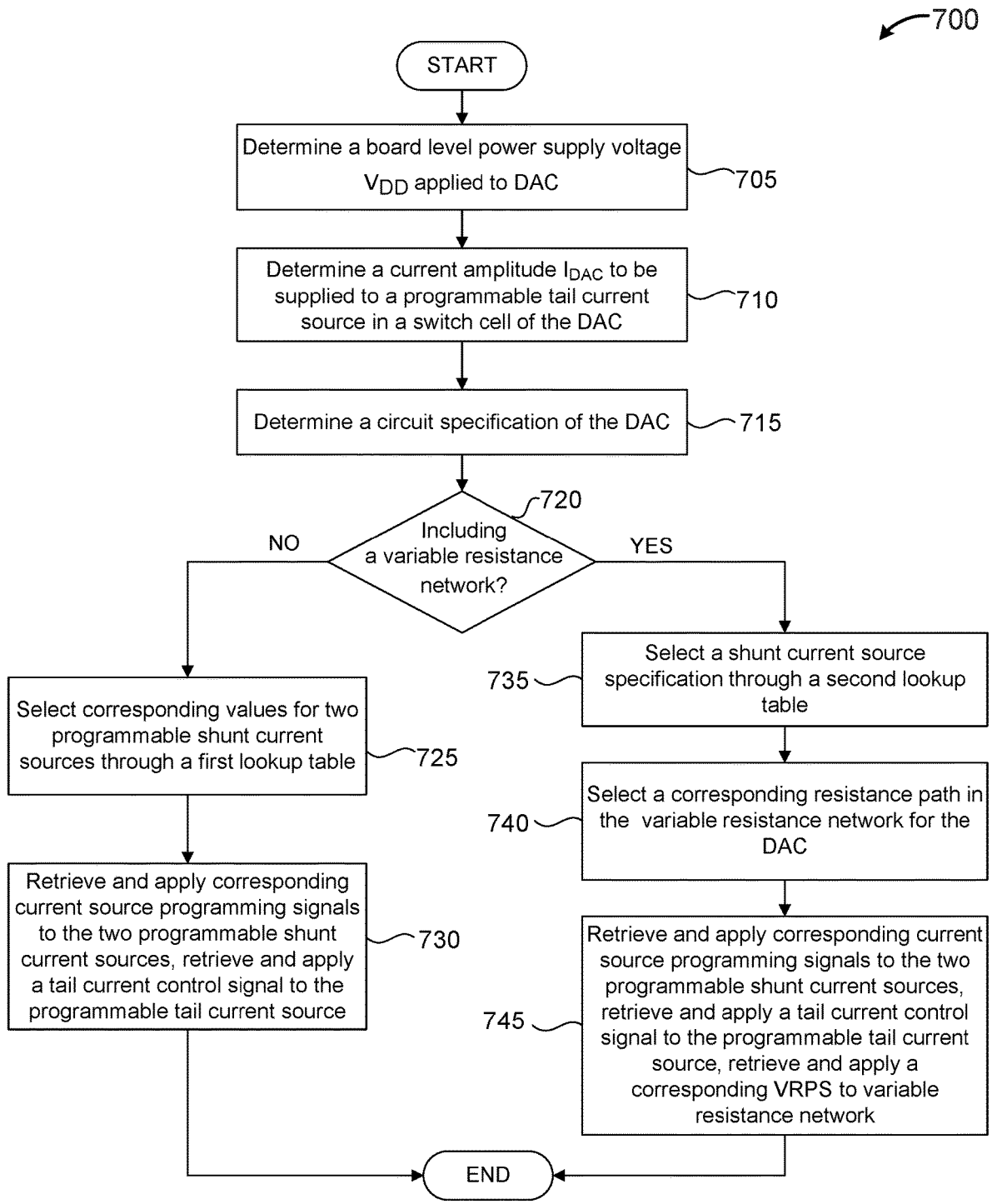
FIG. 7 depicts a flowchart of an exemplary method performed by the control circuit to adjust circuit settings of the DAC described with reference to FIG. 5.

FIG. 7 depicts a flowchart of an exemplary method performed by the control circuit to adjust circuit settings of the DAC described with reference to FIG. 5. As discussed with reference to FIG. 6, the NVM 615 contains a program of instructions that, when executed by the processing engine 610, cause the processing engine 610 to perform operations to generate the current control signals (e.g., the SCCS1, SCCS2 and the TCCS) and the VRPS. A method 700 includes, at 705, determining, by the processing engine 610, a board-level power supply voltage $V_{DD}$ applied to an DAC 500. The method 700 also includes, at 710, determining, by the processing engine 610, the current amplitude $I_{DAC}$ to be supplied to the current source 335a. The method 700 also includes, at 715, determining, a circuit specification (e.g., the resistances of the differential resistances $R_{term}$ 340 and 345, or the resistances of the differential resistance network 265 and resistance paths of the variable resistance network 270) of the DAC 500.

The method 700 also includes, at 720, determining, by the processing engine 610, whether the DAC includes a variable resistance network or not. If the DAC (e.g., the DAC 230) doesn't include a variable resistance network 270, then, at 725, the processing engine 610 selects current amplitude values for the programmable shunt current sources 335b-335c from a first lookup table (e.g., the lookup table shown in FIG. 4A), and, at 730, retrieves corresponding SCCS1, SCCS2 and the TCCS, and applies the retrieved SCCS1, SCCS2 and the TCCS to the programmable shunt current sources 335b-335c, and the programmable tail current source, respectively. Thus, the programmable shunt current sources 335b-335c are configured to have corresponding current amplitudes. Accordingly, a corresponding current amplitude $I_{DAC}$ may be obtained, and desired output power may be generated.

If the DAC (e.g., the DAC 230) includes a variable resistance network 270, then, at 735, the processing engine 610 selects current amplitudes for the programmable shunt current sources 335b-335c from a second lookup table (e.g., the lookup table shown in FIG. 6), and, at 740, select a corresponding resistance path in the variable resistance network 270 (and a voltage at the bias node 555) for the DAC 500. The method 700 also includes, at 745, retrieving corresponding SCCS1, SCCS2, TCCS and VRPS, and applying the retrieved SCCS1, SCCS2, TCCS and VRPS to the DAC 500. Accordingly, a corresponding current amplitude $I_{DAC}$ may be obtained. The DAC 500 may be able to generate a widened range of output power, and desired output power may be generated.

Figure 8:
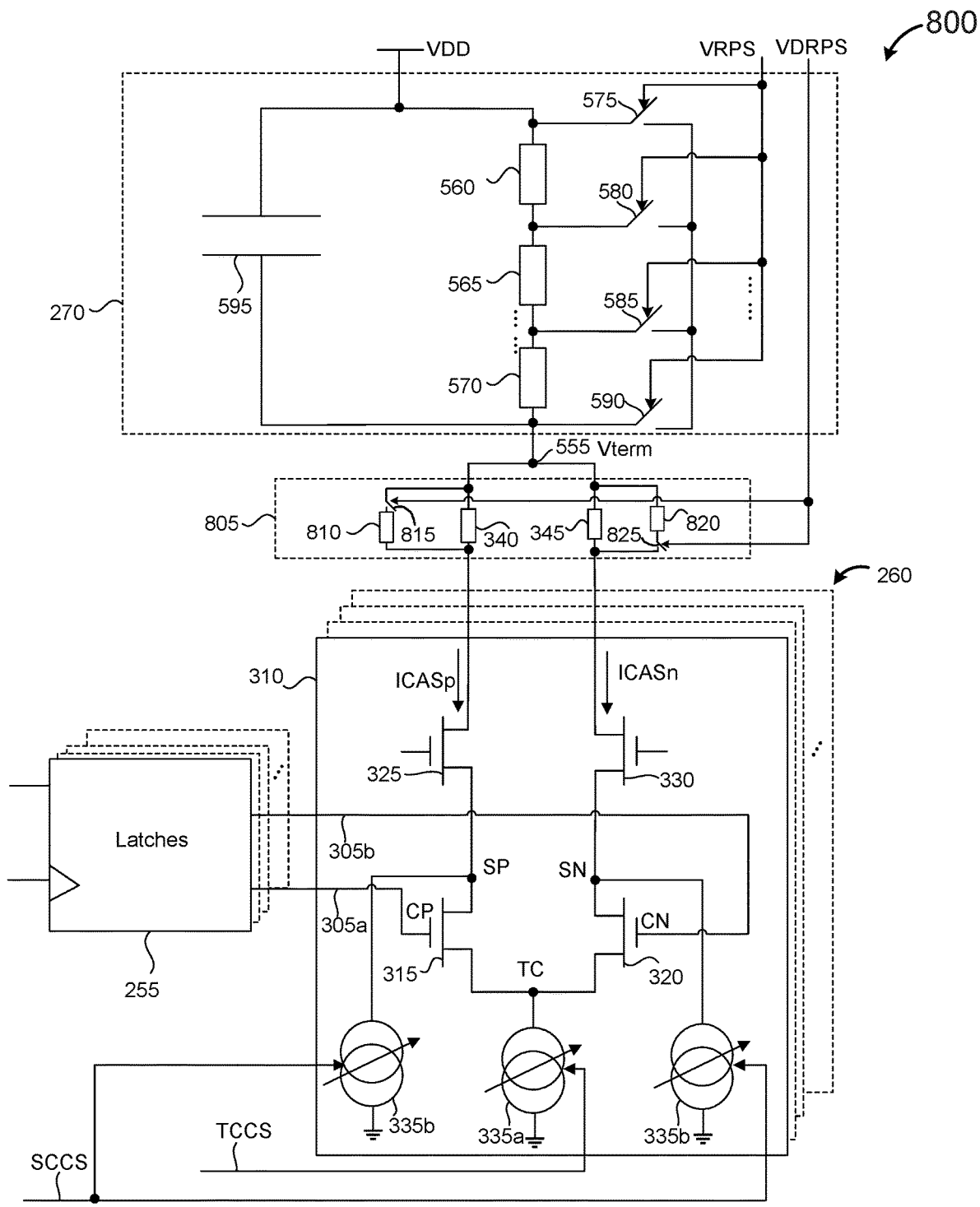
FIG. 8 depicts another exemplary architecture of a current-steering DAC.

FIG. 8 depicts another exemplary architecture of a current-steering DAC. In a DAC 800 in FIG. 8, the differential resistance network 265 shown in FIG. 5 has been replaced by a second differential resistance network 805. The second differential resistance network 805 is coupled to the switch cell circuit 260 operable to provide an output voltage $V_{OUT}$. The second differential resistance network 805 is programmable and under control of a variable differential resistance programming signal (VDRPS). The VDRPS may also be generated by the control circuit 275.

In this depicted example, the second differential resistance network 805 includes the first termination resistance 340 coupled to the drain of the cascode transistor 325 and the second termination resistance 345 coupled to the drain of the cascode transistor 330. The second differential resistance network 805 also includes a first programmable differential resistance path that is connected to the first termination resistance 340 in parallel. The first programmable differential resistance path includes a third termination resistance 810 connected with a first switch 815 in series. The first programmable differential resistance path may be enabled or disabled by controlling the first switch 815. The second differential resistance network 805 also includes a second programmable differential resistance path that is connected to the second termination resistance 345 in parallel. The second programmable differential resistance path includes a fourth termination resistance 820 connected with a second switch 825 in series. The second programmable differential resistance path may be enabled or disabled by controlling the second switch 825. The control circuit 275 may be used to generate variable differential resistance programming signals (VDRPS) to control the first programmable differential resistance path and the second programmable differential resistance path. For example, the VDRPS may be applied to open or close the first switch 815 and the second switch 820 to change the differential resistances. According, a total current flowing into the switch cell circuit 260 may be changed. In some embodiments, the DAC may include the second differential resistance network 805 rather than both the variable resistance network 270 and the second differential resistance network 805, for example.

By programming the second differential resistance network 805 and the variable resistance network 270, the values of the common resistances and differential resistances in the DAC 800 may be set independently, while keeping the board-level power supply $V_{DD}$ constant, the total current flowing through the switch cell circuit 260 may be adjusted. By adjusting the current supplied to the programmable shunt current sources 335b-335c, the current supplied to the programmable tail current source 335a may be dynamically changed, and the output power of the DAC may be then dynamically changed.

In this depicted example, the DAC 230 is arranged on the same integrated circuit (e.g., IC 215) with the control circuit 275 and the amplifier 240. In another embodiment, the DAC 230 may be implemented in a different IC (e.g., another programmable logic) to perform the signal conversion, and the control circuit 275 may be placed in the IC 215 to control the output power of the DAC 230. In some embodiments, the DAC 230 may be implemented as hard block fixed circuitry. For example, an application specific integrated circuit (ASIC) may provide an DAC for with customized hardware circuitry. In some embodiments, the switch cell circuit 260, the differential resistance network 265, and/or the variable resistance network 270 may be implemented in different integrated circuits or in different places of a System-on-Chip (SOC).

In some embodiments, some or all of the functions of the DAC 230/500/800 and/or the control circuit 275 may be implemented in a processor that is configured to execute a set of instructions stored in a data store to control the signal conversion and adjust output power of the DAC. The processor may be arranged on the same integrated circuit, which may be a programmable IC (e.g., FPGA) with the amplifier 240. For example, the DAC 230 and the data store may be implemented in a programmable logic block of a system-on-chip (SOC) or implemented in a hard block using fixed circuitry of the SOC, and the amplifier 240 and the processor may be implemented in another hard block using, for example, fixed circuitry of the SOC.

Figure 9:
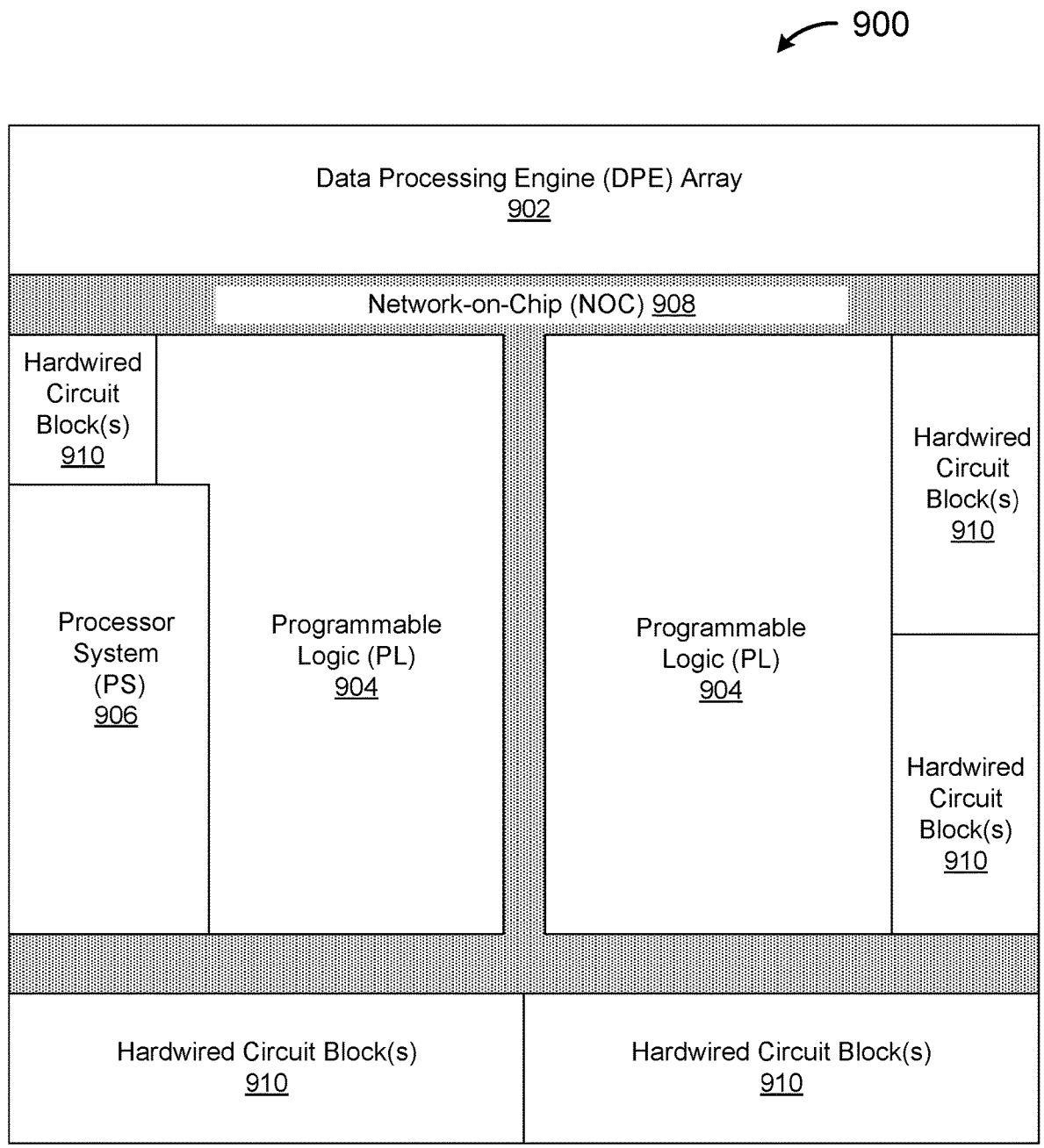
FIG. 9 illustrates another exemplary System-on-Chip (SOC) on which the disclosed circuits and processes may be implemented.

FIG. 9 illustrates another exemplary System-on-Chip (SOC) on which the disclosed circuits and processes may be implemented. In the example of FIG. 9, the various, different subsystems or regions of the SOC 900 illustrated may be implemented on a single die provided within a single integrated package. In other examples, the different subsystems may be implemented on a plurality of interconnected dies provided as a single, integrated package.

In the example, the SOC 900 includes a plurality of regions having circuitry with different functionalities. In the example, the SOC 900 optionally includes a data processing engine (DPE) array 902. SOC 900 includes programmable logic (PL) regions 904 (hereafter PL region(s) or PL), a processing system (PS) 906, a Network on-Chip (NOC) 908, and one or more hardwired circuit blocks 910. DPE array 902 is implemented as a plurality of interconnected, hardwired, and programmable processors having an interface to the other regions of the SOC 900.

PL 904 is circuitry that may be programmed to perform specified functions. As an example, PL 904 may be implemented as field programmable gate array type of circuitry. PL 904 can include an array of programmable circuit blocks. Examples of programmable circuit blocks within PL 904 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 904 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 906 is implemented as hardwired circuitry that is fabricated as part of the SOC 900. The PS 906 may be implemented as, or include, any of a variety of different processor types each capable of executing program code. For example, PS 906 may be implemented as an individual processor, e.g., a single core capable of executing program code. In another example, PS 906 may be implemented as a multicore processor. In still another example, PS 906 may include one or more cores, modules, co-processors, interfaces, and/or other resources. PS 906 may be implemented using any of a variety of different types of architectures. Example architectures that may be used to implement PS 906 may include, but are not limited to, an ARM processor architecture, an x86 processor architecture, a GPU architecture, a mobile processor architecture, a DSP architecture, or other suitable architecture that is capable of executing computer-readable instructions or program code.

NOC 908 includes an interconnecting network for sharing data between endpoint circuits in SOC 900. The endpoint circuits can be disposed in DPE array 902, PL regions 904, PS 906, and/or in hardwired circuit blocks 910. NOC 908 can include high-speed data paths with dedicated switching. In an example, NOC 908 includes horizontal paths, vertical paths, or both horizontal and vertical paths. The arrangement and number of regions shown in FIG. 9 is merely an example. The NOC 908 is an example of the common infrastructure that is available within the SOC 900 to connect selected components and/or subsystems.

NOC 908 provides connectivity to PL 904, PS 906, and to selected ones of the hardwired circuit blocks 910. NOC 908 is programmable. In the case of a programmable NOC used with other programmable circuitry, the nets that are to be routed through NOC 908 are unknown until a user circuit design is created for implementation within the SOC 900. NOC 908 may be programmed by loading configuration data into internal configuration registers that define how elements within NOC 908 such as switches and interfaces are configured and operate to pass data from switch to switch and among the NOC interfaces.

NOC 908 is fabricated as part of the SOC 900 and while not physically modifiable, may be programmed to establish connectivity between different master circuits and different slave circuits of a user circuit design. NOC 908, for example, may include a plurality of programmable switches that are capable of establishing packet switched network connecting user specified master circuits and slave circuits. In this regard, NOC 908 is capable of adapting to different circuit designs, where each different circuit design has different combinations of master circuits and slave circuits implemented at different locations in the SOC 900 that may be coupled by NOC 908. NOC 908 may be programmed to route data, e.g., application data and/or configuration data, among the master and slave circuits of the user circuit design. For example, NOC 908 may be programmed to couple different user-specified circuitry implemented within PL 904 with PS 906, and/or DPE array 902, with different hardwired circuit blocks, and/or with different circuits and/or systems external to the SOC 900.

The hardwired circuit blocks 910 may include input/output (I/O) blocks, and/or transceivers for sending and receiving signals to circuits and/or systems external to SOC 900, memory controllers, or the like. Examples of different I/O blocks may include single-ended and pseudo differential I/Os and high-speed differentially clocked transceivers. Further, the hardwired circuit blocks 910 may be implemented to perform specific functions. Examples of hardwired circuit blocks 910 include, but are not limited to, cryptographic engines, digital-to-analog converters, analog-to-digital converters, and the like. The hardwired circuit blocks 910 within the SOC 900 may be referred to herein from time-to-time as application-specific blocks.

In the example of FIG. 9, PL 904 is shown in two separate regions. In another example, PL 904 may be implemented as a unified region of programmable circuitry. In still another example, PL 904 may be implemented as more than two different regions of programmable circuitry. The particular organization of PL 904 is not intended as a limitation. In this regard, SOC 900 includes one or more PL regions 904, PS 906, and NOC 908. DPE array 902 may be optionally included.

In other example implementations, the SOC 900 may include two or more DPE arrays 902 located in different regions of the IC. In still other examples, the SOC 900 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Although various embodiments have been described with reference to the figures, other embodiments are possible. For example, the control circuit 275 may be implemented in the DAC 230. In another example, the amplifier 240 may be implemented outside of IC 215.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit comprising:
   (a) a switch cell circuit comprising at least one switch cell, each of the at least one switch cells comprising:
      (a1) a differential pair of transistors having respective first and second control nodes, respective first and second shunt nodes, and a tail current node;
      (a2) a programmable tail current source, having two terminals, configured to draw current proportional to a tail current control signal with one terminal coupled to the tail current node and the other terminal coupled to a predetermined reference voltage;
      (a3) a first programmable shunt current source, having two terminals, configured to draw current proportional to a first shunt current control signal with one terminal coupled to the first shunt node and the other terminal coupled to the predetermined reference voltage; and,
      (a4) a second programmable shunt current source, having two terminals, configured to draw current proportional to a second shunt current control signal with one terminal coupled to the second shunt node and the other terminal coupled to the predetermined reference voltage,
   wherein the first and second programmable shunt current sources are configured to compensate for adjustments to the tail current by maintaining a total current of the switch cell at a controllable operating point by adjusting the first and second shunt current control signals in opposite polarity with respect to the tail current control signal.

2. The circuit of claim 1, further comprising: a first resistance coupled between a bias node and the first shunt node, and a second resistance coupled between the bias node and second first shunt node.

3. The circuit of claim 2, wherein each of the at least one switch cells further comprises: a first cascode transistor coupled between the first resistance and the first shunt node, and a second cascode transistor coupled between the second resistance and the second shunt node.

4. The circuit of claim 3, further comprising: a control circuit configured to generate the first and second shunt current control signals as a function of predetermined circuit parameters.

5. The circuit of claim 4, wherein the circuit parameters further comprise a resistance value of the first resistance and a resistance value of the second resistance.

6. The circuit of claim 4, wherein the control circuit comprises:
   a processing engine operatively coupled to the first and second programmable shunt current sources;
   a data store coupled to the processing engine and containing a program of instructions that, when executed by the processing engine, cause the processing engine to perform operations to generate the first and second shunt control signals in response to a first lookup table storing one or more predetermined settings for the shunt current control signals as a function of the tail current control signals.

7. The circuit of claim 4, further comprising: a programmable resistance network coupled between a power supply node and the bias node, wherein a variable resistance programming signal (VRPS) is configured to adjust a resistance of the programmable resistance network to one of a predetermined set of resistance values to adjust a voltage at the bias node.

8. The circuit of claim 7, wherein the control circuit is further configured to generate the VRPS in response to a second lookup table storing one or more predetermined settings for the VRPS.

9. The circuit of claim 8, further comprising: a capacitance arranged in a parallel configuration with at least a portion of the programmable resistance network.

10. The circuit of claim 1, wherein the first and second shunt control signals are independently controllable with respect to each other.

11. A method, comprising:
   (a) providing a differential pair of transistors having respective first and second control nodes, respective first and second shunt nodes, and a tail current node;
   (b) providing a programmable tail current source having two terminals, and configuring the programmable tail current source to draw current proportional to a tail current control signal, coupling one terminal to the tail current node and coupling the other terminal to a predetermined reference voltage;

(c) providing a first programmable shunt current source having two terminals, and configuring the first programmable shunt current source to draw current proportional to a first shunt current control signal, coupling one terminal to the first shunt node and coupling the other terminal to the predetermined reference voltage; and, (d) providing a second programmable shunt current source having two terminals, and configuring the second programmable shunt current source to draw current proportional to a second shunt current control signal and, coupling one terminal to the second shunt node and coupling the other terminal to the predetermined reference voltage, wherein the first and second programmable shunt current sources are configured to compensate for adjustments to the tail current by maintaining a total current of the switch cell at a controllable operating point by adjusting the first and second shunt current control signals in opposite polarity with respect to the tail current control signal.

12. The method of claim 11, further comprising: coupling a first resistance between a bias node and the first shunt node; and, coupling a second resistance between the bias node and second first shunt node.

13. The method of claim 12, further comprising: coupling a first cascode transistor between the first resistance and the first shunt node; and, coupling a second cascode transistor between the second resistance and the second shunt node.

14. The method of claim 13, further comprising: configuring a control circuit to generate the first and second shunt current control signals as a function of predetermined circuit parameters.

15. The method of claim 14, wherein the circuit parameters further comprise a resistance value of the first resistance and a resistance value of the second resistance.

16. The method of claim 14, wherein the control circuit comprises:

a processing engine operatively coupled to the first and second programmable shunt current sources; and, a data store coupled to the processing engine and containing a program of instructions that, when executed by the processing engine, cause the processing engine to perform operations to generate the first and second shunt current control signals in response to a first lookup table storing one or more predetermined settings for the shunt current control signals as a function of the tail current control signals.

17. The method of claim 14, further comprising: providing a programmable resistance network coupled between a power supply node and the bias node, wherein a variable resistance programming signal (VRPS) is configured to adjust a resistance of the programmable resistance network to one of a predetermined set of resistance values to adjust a voltage at the bias node.

18. The method of claim 17, wherein the control circuit is further configured to generate the VRPS in response to a second lookup table storing one or more predetermined settings for the VRPS.

19. The method of claim 18, further comprising: providing a capacitance arranged in a parallel configuration with at least a portion of the programmable resistance network.

20. The method of claim 11, wherein the first and second shunt control signals are independently controllable with respect to each other.

* * * * *